United States Patent [19]
Pollock et al.

[11] Patent Number: 5,354,717
[45] Date of Patent: Oct. 11, 1994

[54] METHOD FOR MAKING A SUBSTRATE STRUCTURE WITH IMPROVED HEAT DISSIPATION

[75] Inventors: Randy L. Pollock, Austin, Tex.; George F. Anderson, Jr., Cave Creek, Ariz.

[73] Assignee: Motorola, Inc., Schaumburg, Ill.

[21] Appl. No.: 99,682

[22] Filed: Jul. 29, 1993

[51] Int. Cl.$^5$ ............................................ H01L 21/302
[52] U.S. Cl. ..................................... 437/225; 437/21;
437/83; 437/100; 437/974; 148/DIG. 135;
148/DIG. 150
[58] Field of Search ..................... 437/209, 62, 63, 84,
437/225, 21, 974, 83, 100; 148/DIG. 135, DIG. 150

[56] References Cited
U.S. PATENT DOCUMENTS

| | | | |
|---|---|---|---|
| 4,540,452 | 9/1985 | Croset et al. | 437/84 |
| 4,689,583 | 8/1987 | Jeninic et al. | . |
| 4,698,901 | 10/1987 | Davies et al. | . |
| 4,946,716 | 8/1990 | Corrie | 148/DIG. 135 |
| 4,981,818 | 1/1991 | Anthony et al. | 148/DIG. 135 |
| 4,983,251 | 1/1991 | Haisma et al. | 437/62 |
| 4,983,538 | 1/1991 | Gotou | 148/DIG. 135 |
| 5,028,558 | 7/1991 | Haisma et al. | 437/62 |
| 5,034,343 | 7/1991 | Rouse et al. | 437/62 |
| 5,045,972 | 9/1991 | Supan et al. | . |
| 5,120,495 | 6/1992 | Supan et al. | . |
| 5,124,179 | 6/1992 | Garg et al. | . |
| 5,126,206 | 6/1992 | Garg et al. | . |
| 5,128,006 | 7/1992 | Mitchell et al. | . |
| 5,131,963 | 7/1992 | Ravi | 148/DIG. 135 |
| 5,196,375 | 3/1993 | Hoshi | 148/DIG. 135 |

OTHER PUBLICATIONS

Cheap Diamond Films: Expect Mechanical, Optical, and Electronics Applications, High-Tech Materials Alert, Jun. 1987, pp. 5-8.
Chementator, Chemical Engineering, Nov. 1992, p. 25.
Inside R&D, Nov. 4, 1992, p. 7.
D. J. Pickrell et al., Chemical Vapor Deposition of Diamond for Electronic Packaging Applications, Inside ISHM, Jul./Aug. 1991, pp. 11–15.
J. L. Davidson et al., Selective Deposition of Diamond Films, Journal of Electronic Materials, vol. 18, No. 6, 1989, pp. 711–715.
Science and Business Scientific American, Aug. 1989, pp. 60–62.
A. B. Harker, Diamond Films: Hard Materials to Beat, R& D Magazine, Mar. 1990, pp. 84–92.

Primary Examiner—Tom Thomas
Assistant Examiner—Kevin M. Picardat
Attorney, Agent, or Firm—Aaron Bernstein

[57] ABSTRACT

A method for making a substrate structure with improved heat dissipation is provided. A semiconductor wafer (14) is provided. A diamond layer (12) is formed on the back (20) of the wafer (14). The diamond layer (12) provides structural support and heat dissipation. In certain embodiments, the diamond layer may be an amorphous diamond substrate (12) bonded to the semiconductor wafer (14), In certain other embodiments the diamond layer (12) may be a thin film layer (12) deposited on the back of the semiconductor wafer (14). The semiconductor wafer (14) is thinned to a minimum thickness necessary for forming an electronic device in a surface (22) of the wafer (14).

6 Claims, 1 Drawing Sheet

METHOD FOR MAKING A SUBSTRATE STRUCTURE WITH IMPROVED HEAT DISSIPATION

BACKGROUND OF THE INVENTION

The present invention relates, in general, to substrate structures, and more particularly, to substrate structures having improved heat dissipation capabilities.

Conventionally, electronic solid-state devices are formed in semiconductor substrates such as disk-shaped silicon wafers. Typically, many identical devices are formed in the surface of a wafer. After the devices are formed, the wafer is typically cut into individual dies each die comprising a single device.

Modern applications for the solid-state devices formed in wafers require increasingly higher power devices. For example, applications in telecommunications require high power radio frequency amplifiers. Additionally, as digital microprocessors become more complex they require higher power.

The higher power of the modern devices directly results in an increase in the creation of heat during the operation of the devices. The heat created by the devices must be dissipated in order for the devices to maintain acceptable operating temperatures.

A typical approach to dissipating heat from a semiconductor device is attachment to a heat sink which can efficiently conduct heat away from the device. Common heat sinks comprise metal such as copper, which is naturally a good heat conductor. Unfortunately, the typical semiconductor device will not operate properly if an electrical conducting material such as copper is directly attached to it. Consequently, in the past, individual die comprising individual semiconductor devices have been attached to ceramic substrates which are then attached to a metal heat sink. The ceramic substrate provides electrical isolation (insulation) between the semiconductor device and the metal heat sink. Unfortunately, the ceramic substrates are not particularly efficient in conducting heat away from the semiconductor device to the heat sink. An additional approach which has been taken is to thin the semiconductor substrate in which the electronic device is formed in order to minimize the amount of semiconductor material through which the heat must pass, since the heat is generated at the surface of the substrate where the device is formed. The thinned substrate may then be separated into individual die and attached to ceramic insulators and heat sinks as discussed above. Unfortunately, the substrates can not be thinned as much as desirable because they become subject to breaking during further processing.

Consequently, what is needed is a method for forming a semiconductor structure with improved heat dissipation. It would be desirable to provide electrical isolation without compromising heat dissipation. Additionally, it would be desirable to incorporate the electrical isolation and heat sinking while the wafer is still whole, rather than individually after dies have been separated out. This would significantly simplify processing and packaging. Additionally, it would be desirable to provide structural support to the semiconductor wafer so that it could be thinned to the very smallest thickness required for forming the electronic devices.

SUMMARY OF THE INVENTION

Briefly stated, the present invention is a method for forming a semiconductor structure with improved heat dissipation. A semiconductor substrate is provided. Subsequently, the semiconductor substrate is thinned. Additionally, a diamond layer is formed on one surface of the semiconductor substrate, thereby providing structural support and heat dissipation for the thinned semiconductor substrate.

The term "diamond", as used to describe materials associated with the invention, is intended to mean substantially diamond.

DETAILED DESCRIPTION OF THE DRAWINGS

Figure 1:
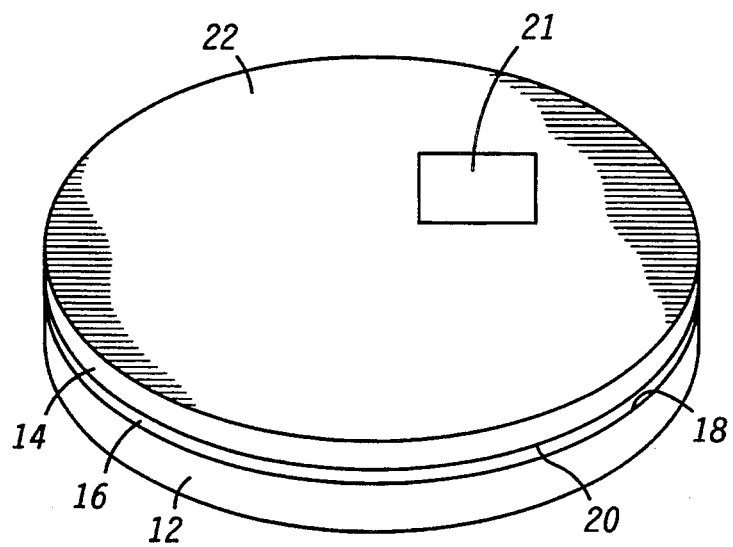
FIG. 1 is a perspective view of a substrate structure made by a preferred method in accordance with the present invention.

Referring to FIG. 1, generally, a substrate structure made by the preferred method in accordance with the present invention comprises semiconductor substrate 14 supported by diamond substrate 12. Semiconductor substrate 14 is thinned to the minimum thickness required to form an electronic device in upper surface 22 of semiconductor substrate 14. As explained in more detail below, according to the preferred method, diamond substrate 12 is bonded to semiconductor substrate 14. The bonding process results in the formation of silicon carbide layer 16. The preferred method results in a semiconductor layer 14 thinner than previously possible, structurally supported by diamond substrate 12. Moreover, diamond substrate 12 provides heat conduction and dissipation on the order of five times better than even a copper heat sink, while additionally providing electrical insulation which is required by the electronic devices formed in semiconductor substrate 14. Furthermore, the electrical insulation and heat sink are formed early in the device process, before individual die are cut. This significantly simplifies further processing and packaging because, for example, individual die do not need to be attached to ceramic substrates which would then need to be attached to metal heat sinks.

More specifically, referring again to FIG. 1, diamond substrate 12 is provided. According to the preferred method, diamond substrate 12 comprises a diamond substrate of the type commercially available from, for example, Diamonex ™ as disclosed in D. Pickrell, et al., *Chemical Vapor Deposition Of Diamond for Electronic Packaging Applications,* ISIDEISHM, July/August 1991, pp. 11–15. It will be understood that various types of diamond layer, such as amorphous or polycrystalline diamond, or single crystalline diamond, could be used. The diamond layer 12 comprises a top surface 18.

Additionally, according to the preferred method, a silicon substrate 14 is provided. It will also be understood that various semiconductor materials may be substituted for the silicon used in accordance with the preferred method. The silicon semiconductor substrate 14 comprises a first surface 20, which faces diamond substrate 12, and second surface 22, which is the top surface.

According to the preferred method, silicon semiconductor substrate 14 is thinned to the minimum thickness required to form the desired electronic device in substrate 14. This can be as thin as 1-2 mils. Such a thinness has not been used in a similar context because the wafer would be unmanageably thin. However, as explained in detail below, the thin substrate 14 will be structurally supported by diamond substrate 12 during further processing and packaging.

According to the preferred method, first surface 20 of substrate 14 is planarized to permit bonding to diamond substrate 12. Likewise, top surface 18 of diamond substrate 12 is planarized. Subsequently, top surface 18 of diamond substrate 12 is brought into contact with first surface 20 of substrate 14. According to the preferred method, substrate 14 is bonded to diamond substrate 12 by heat cycling the entire structure so as to form a thin silicon carbide layer 16 at the interface of the contacting surfaces. Silicon carbide layer 16 will typically be no thicker than 1–5 atoms.

Once the entire substrate structure shown in FIG. 1 is formed, a plurality of electronic devices, represented by electronic device 21, are formed in second surface 22 of semiconductor substrate 14, according to well known methods. It will be understood that electronic device 21 is one of many identical devices formed on substrate 14. During processing, superior structural support and heat dissipation is provided by diamond substrate 12. Furthermore, once individual die are separated and packaged, superior electrical insulation and heat dissipation are provided by diamond substrate 12. According to the preferred method, diamond substrate 12 is provided with a thickness in the range of 10–20 mils.

The preferred method has been described to include the step of thinning semiconductor substrate 14 before contacting and bonding semiconductor substrate 14 to diamond substrate 12. However, consistent with the preferred method, semiconductor substrate 14 may be joined with diamond substrate 12 before it is thinned. This may be desirable where structural support from the diamond substrate 12 is required during the thinning process of semiconductor substrate 14, for example, where semiconductor substrate 14 is thinned by grinding. Additionally, the electronic devices formed in semiconductor substrate 14 may be formed before substrate 14 is thinned and attached to diamond substrate 12. This may be desirable because existing device fabrication processes can be used without modifications which take into account the addition of diamond substrate 12.

Figure 2:
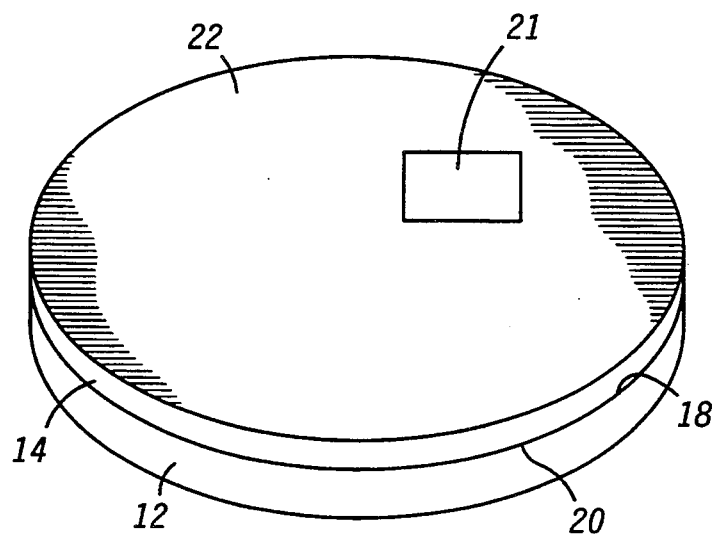
FIG. 2 is a perspective view of a substrate structure made by an alternate method in accordance with the present invention.

FIG. 2 illustrates a substrate structure made by an alternate method in accordance with the present invention. The portions of the structure shown in FIG. 2 which are analogous to those shown in FIG. 1 are identified by the same references numbers. A notable difference between the structure of FIG. 2 and the structure of FIG. 1 is that in the structure of FIG. 2 diamond layer 12 is chemically deposited on semiconductor layer 14, rather than provided as a separate substrate and bonded to semiconductor substrate 14.

More specifically, according to the alternate method of producing the structure shown in FIG. 2, silicon semiconductor substrate 14 is provided. Semiconductor substrate 14 comprises first surface 20 and second surface 22. Diamond layer 12, comprising top surface 18, is chemically deposited on first surface 20 of semiconductor substrate 14. The step of depositing diamond layer 12 may comprise, for example, depositing a thin film of amorphous diamond, polycrystalline diamond, or single crystalline diamond. In this alternate method, diamond layer 12 is deposited to a thickness in the range of 10–20 mils. Acceptable methods for chemically depositing diamond are disclosed in U.S. Pat. Nos. 5,124,179 and 5,126,206, which are incorporated herein by reference.

Subsequently, semiconductor substrate 14 is thinned to the minimum thickness required for forming the desired electronic device 21 in surface 22. According to this alternate method, semiconductor substrate 14 is thinned to a thickness within the range of 1–2 mils. After substrate 14 is thinned, a plurality of electronic devices, represented by device 21, are formed in surface 22 according to well known fabrication methods.

By now it should be appreciated that a method for making a substrate structure with improved heat dissipation is provided. The method provides a structure which allows the semiconductor substrate containing electronic devices to be thinned to a degree previously impractical. Additionally, electrical insulation and heat sinking is provided in a single diamond layer. Furthermore, the insulation and heat sinking is provided to all individual devices at once, rather than separately after the wafer has been separated into die, as in the prior art.

We claim:

1. A method for making a substrate structure with improved heat dissipation, comprising the steps of:
   providing a diamond substrate comprising a top surface;
   providing a semiconductor device substrate, separate from the diamond substrate, the semiconductor substrate comprising first and second surfaces;
   thinning the semiconductor device substrate;
   planarizing the top surface of the diamond substrate and the first surface of the semiconductor device substrate;
   contacting the top surface of the diamond substrate with the first surface of the semiconductor device substrate;
   bonding the diamond substrate to the semiconductor device substrate, thereby providing structural support and heat dissipation to the semiconductor device substrate; and
   forming an electronic device on the second surface of the semiconductor device substrate, opposite the diamond substrate.

2. The method of claim 1, wherein the step of providing a diamond substrate comprises providing an amorphous diamond substrate having thickness in the range of 10–20 mils, and wherein the step of thinning the semiconductor device substrate comprises thinning the semiconductor device substrate to a thickness in the range of 1–2 mils.

3. The method of claim 1, wherein the step of thinning occurs before the step of contacting.

4. The method of claim 1, wherein the step of contacting occurs before the step of thinning.

5. The method of claim 1, wherein the step of forming an electronic device occurs before the step of thinning.

6. The method of claim 1, wherein the step of thinning the semiconductor device semiconductor substrate comprises thinning the semiconductor device semiconductor substrate to a thickness in the range of 1–2 mils.

* * * * *

UNITED STATES PATENT AND TRADEMARK OFFICE
CERTIFICATE OF CORRECTION

PATENT NO. : 5,354,717
DATED : October 11, 1994
INVENTOR(S) : Randy L. Pollock
George F. Anderson, Jr.

It is certified that error appears in the above-indentified patent and that said Letters Patent is hereby corrected as shown below:

Claim 6, column 4, line 61
Delete second "semiconductor".

Claim 6, column 4, line 62/63
Delete second "semiconductor".

Signed and Sealed this

Twenty-first Day of October 1997

Attest:

BRUCE LEHMAN

*Attesting Officer*  *Commissioner of Patents and Trademarks*